United States Patent [19]

Valdettaro

[11] 4,056,796

[45] Nov. 1, 1977

[54] DETENTED UHF TELEVISION TUNER WITH INDEPENDENT INDUCTIVE FINE TUNING

[75] Inventor: Alarico A. Valdettaro, Bloomington, Ind.

[73] Assignee: Sarkes Tarzian, Inc., Bloomington, Ind.

[21] Appl. No.: 734,327

[22] Filed: Oct. 20, 1976

[51] Int. Cl.² ............................ H03J 1/14; H03J 5/06
[52] U.S. Cl. .................................. 334/55; 74/10.41; 74/10.6; 334/65; 334/74; 334/88
[58] Field of Search ...................... 334/47, 51, 74, 55, 334/57, 65, 88; 74/10.41, 10.6

[56] References Cited

U.S. PATENT DOCUMENTS

| 3,495,196 | 2/1970 | Fulton | 334/51 |
| 3,842,683 | 10/1974 | Valdettaro | 334/47 X |
| 3,973,229 | 8/1976 | Weigel | 334/88 X |

*Primary Examiner*—Paul L. Gensler
*Attorney, Agent, or Firm*—Mason, Kolehmainen, Rathburn & Wyss

[57] ABSTRACT

A UHF television tuner utilizes a mechanical fine tuning mechanism that alters the operation frequency of the oscillator of the tuner independently of the position of the main tuning shaft. The mechanical fine tuning mechanism utilizes a tuning slug disposed inside a tunable coil of the oscillator, and a rotary to linear motion translating mechanism is disposed within the fine tuning shaft for converting a rotational motion of the fine tuning shaft to a linear motion of the slug inside the coil.

22 Claims, 12 Drawing Figures

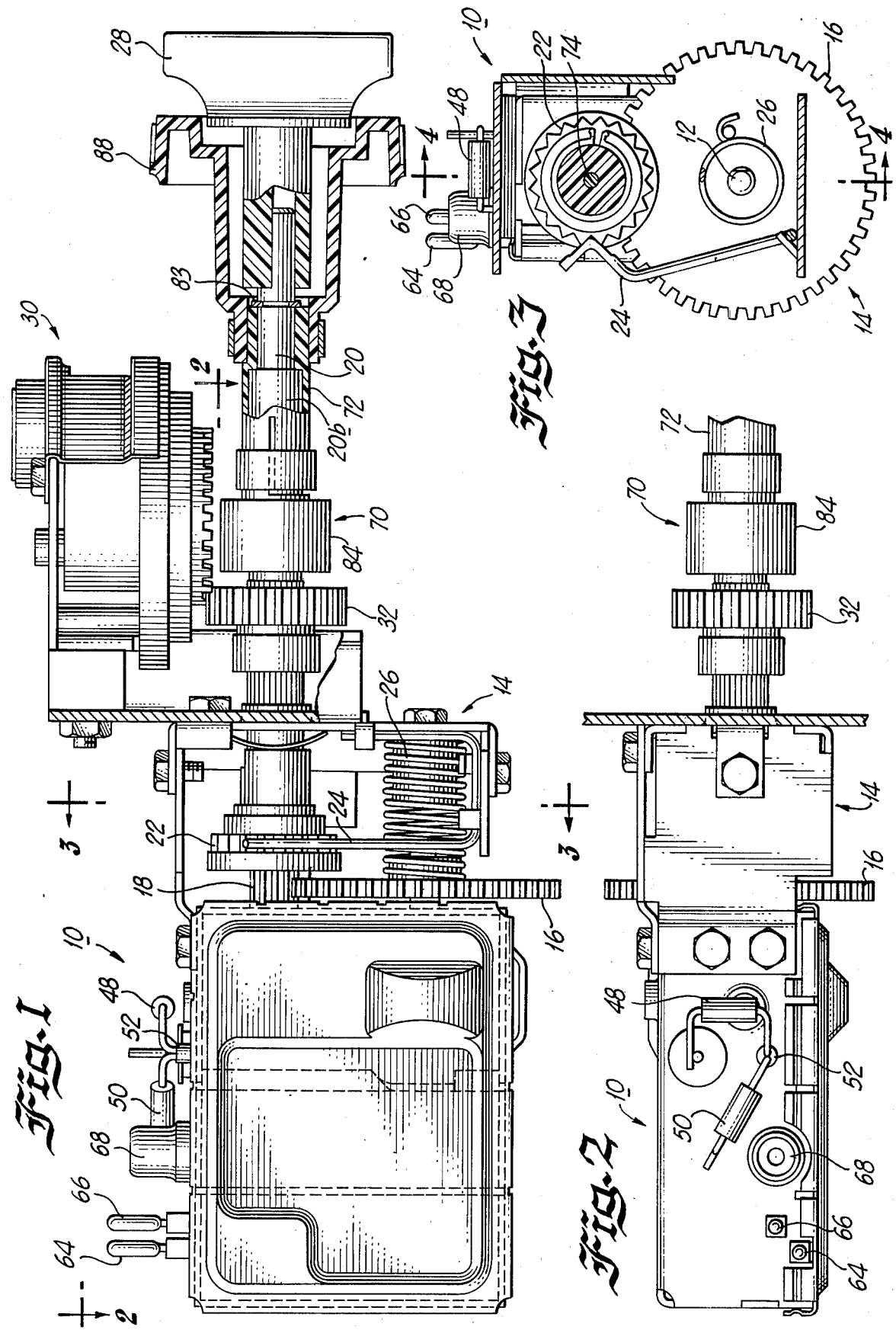

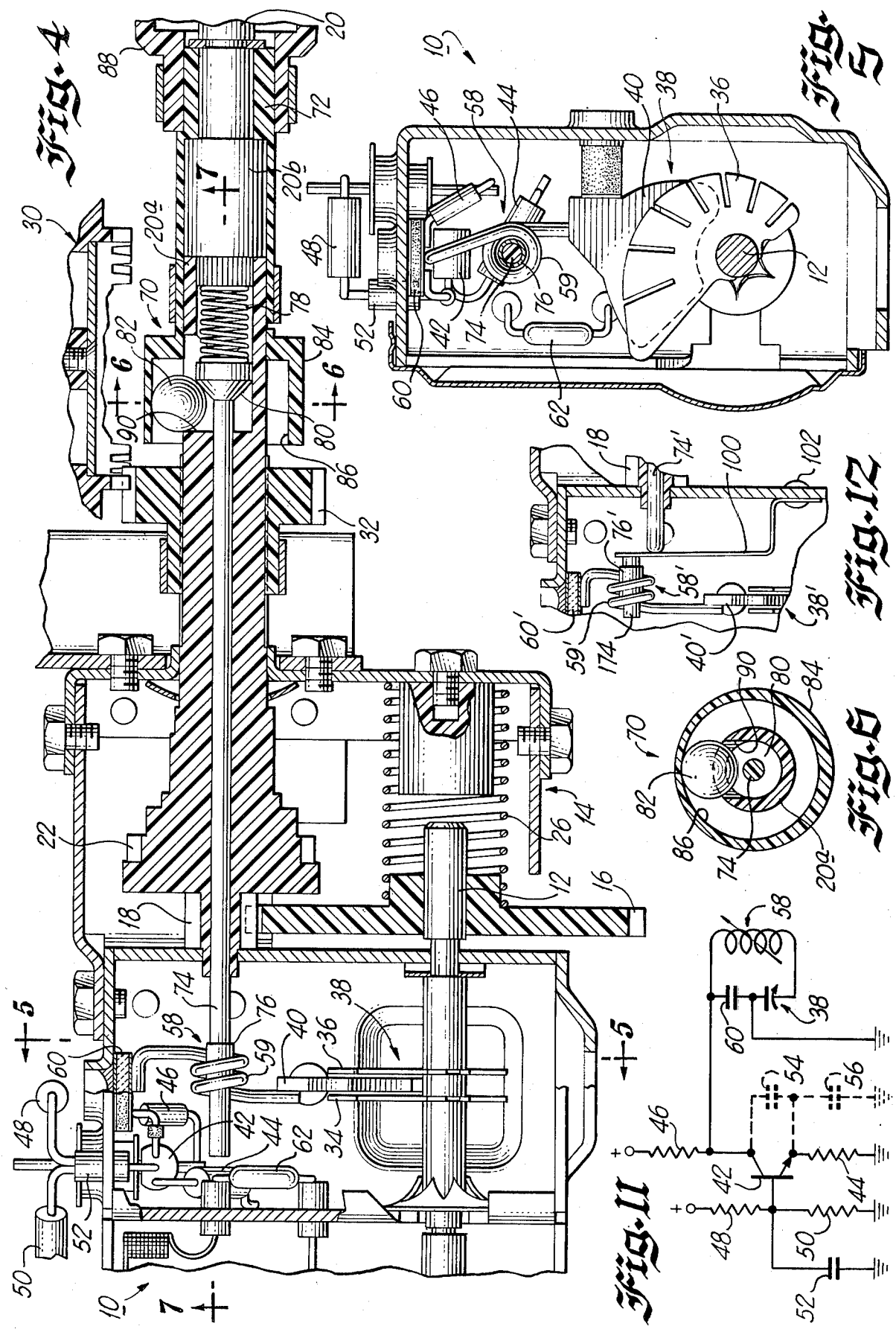

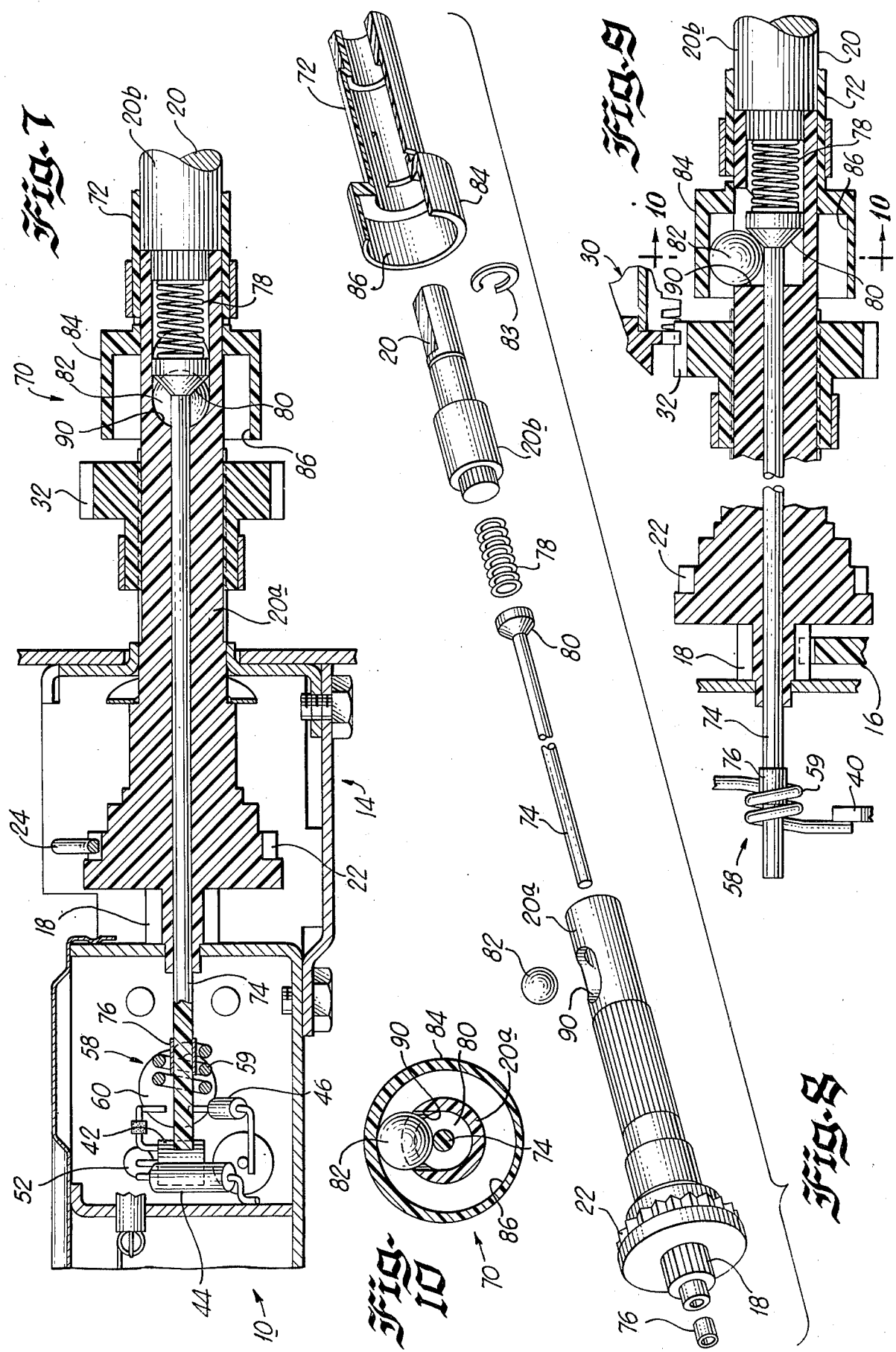

DETENTED UHF TELEVISION TUNER WITH INDEPENDENT INDUCTIVE FINE TUNING

BACKGROUND OF THE INVENTION

This invention relates generally to tuners, and more particularly, to UHF television tuners of the detented type.

Detented UHF television tuners are known. Such detented tuners usually employ a UHF tuner having a continuously variable main tuning shaft and a detented channel selector shaft. A gear mechanism is generally used for mechanically coupling the selector shaft to the main tuning shaft. In addition, a fine tuning shaft is usually mechanically coupled to the main tuning shaft through a gear mechanism or the like, and serves to rotate the main tuning shaft over a predetermined range of rotation about each detent position established by the channel selector shaft. A clutch is generally interposed between the channel selector shaft and the main tuning shaft to permit the main tuning shaft to be rotated by the fine tuning shaft while the channel selector shaft is constrained by the detenting mechanism. Three such prior art tuners are described in U.S. Pat. Nos. 3,774,459; 3,842,683; and 3,916,820, incorporated herein by reference.

While these systems provide a UHF television tuner having a detented selector shaft and a fine tuning shaft for fine tuning the tuner at each of the detent positions of the selector shaft, such tuners suffer from a phenomenon known as inertial creep. The inertial creep phenomenon is caused by a rapid acceleration and deceleration of the selector shaft as it is rotated from one detent position to another, causing gradual slippage of the clutch coupling the main tuning shaft to the selector shaft, thereby resulting in a gradual detuning of the tuner after repeated channel changes.

One way to eliminate the inertial creep problem is to provide a fine tuning mechanism that operates independently of the main tuning shaft. This permits the main tuning shaft to be coupled to the channel selector shaft directly without the use of a clutch and eliminates the clutch slippage problem. A circuit for electrically achieving the independent fine tuning utilizing a voltage variable capacitor to adjust the tuning of the local oscillator of the UHF tuner is described in the above-referenced U.S. Pat. No. 3,842,683. Another system utilizing a mechanically operated piston capacitor to tune the local oscillator of the UHF tuner is described in U.S. Pat. No. 3,972,240 also issued to the same inventor as the inventor of the present invention and assigned to the present assignee.

While the above-described systems do provide a way to eliminate the inertial creep problem, the electrical fine tuning system described in U.S. Pat. No. 3,842,683 has a tuning range that is limited by the capacitance range of the voltage variable capacitor, and which is highly dependent on the physical layout of the circuit. The mechanical system described in U.S. Pat. No. 3,972,240 is somewhat cumbersome and therefore not suited to portable applications. Furthermore, the use of a piston capacitor increases the cost of the tuner, thus making it impractical for use in low cost television receivers. Also, the mechanism for adjusting the piston capacitor tends to have some degree of backlash, thus affecting the resettability of the tuner.

SUMMARY OF THE INVENTION

Accordingly, it is an object of the present invention to provide a detented UHF television tuner that overcomes many of the disadvantages of the prior art systems.

It is another object of the present invention to provide a detented type UHF television tuner utilizing an improved mechanical fine tuning system that operates independently of the main tuning shaft.

It is yet another object of the present invention to provide a detented UHF television tuner having a compact, low cost mechanical fine tuning system that operates independently of the main tuning shaft.

It is still another object of the present invention to provide a minimum backlash fine tuning system for a detented UHF television tuner that operates independently of the main tuning shaft.

These and other objects and advantages of the present invention will be readily apparent from the following specification and attached drawings wherein:

FIG. 1 is a side view of a detented UHF television tuner utilizing the fine tuning system according to the present invention;

FIG. 2 is a partial top view of the UHF tuner illustrated in FIG. 1 taken along line 2—2 of FIG. 1;

FIG. 3 is a front sectional view of the UHF tuner taken along line 3—3 of FIG. 1;

FIG. 4 is a partial side sectional view of the UHF television tuner illustrating the fine tuning mechanism in detail taken along line 4—4 of FIG. 3;

FIG. 5 is a front sectional view of the UHF television tuner taken along line 5—5 of FIG. 4;

FIG. 6 is a detailed sectional view of a portion of the fine tuning mechanism taken along line 6—6 of FIG. 4;

FIG. 7 is another detailed sectional view of the fine tuning mechanism taken along line 7—7 of FIG. 4;

FIG. 8 is an exploded perspective view of a portion of the fine tuning mechanism according to the invention;

FIG. 9 is a detailed partial sectional view of the fine tuning mechanism;

FIG. 10 is a sectional view similar to FIG. 6 taken along line 10—10 of FIG. 9 and showing the fine tuning mechanism in an alternate position from that of FIG. 6;

FIG. 11 is a schematic diagram of the local oscillator of the UHF television tuner; and FIG. 12 is a partial sectional view of an alternative embodiment of the fine tuning mechanism according to the invention.

DETAILED DESCRIPTION OF THE PREFERRED EMBODIMENT

Referring now to the drawings, with particular attention to FIG. 1, there is shown a detented UHF tuner according to the invention. The detented UHF tuner according to the invention utilizes a continuously variable UHF tuner generally designated by the reference numeral 10 having a continuously variable main tuning shaft 12 (FIGS. 3 and 4) extending therefrom. A detenting mechanism, generally designated by the reference numeral 14 utilizes a pair of gears 16 and 18 to couple the main tuning shaft to a channel selector shaft 20 (FIGS. 1 and 4). A detent wheel 22 and a detenting spring 24 provide a plurality of individual stops for the selector shaft 20, each stop being associated with a unique position of the main tuning shaft corresponding to one of the television channels in the UHF band. A torsion spring 26 applies a preloading force to the gears 16 and 18 to minimize backlash. The detenting mechanism 14 is similar to the one described in the referenced U.S. Pat. Nos. 3,774,459; 3,916,820; and 3,972,240 and will not be explained in great detail in the present specification.

A channel selector knob 28 is affixed to the channel selector shaft 20 and rotates the main tuning shaft 12 via the gears 16 and 18. In addition, the channel selector knob 28 operates a channel indicator dial 30 via a gear 32 affixed to the channel selector shaft 20. The channel indicator 30 may be similar to the channel indicator described in the referenced U.S. Pat. No. 3,916,820 or any other suitable indicator that provides an indication of the channel to which the UHF tuner 10 is tuned. In the present embodiment, the indicator 20 is advanced one increment each time the channel selector shaft is advanced by one detent position, and provides a unique and unambiguous indication of the number of the channel being received.

Rotation of the channel selector knob 28 imparts a rotational motion to the main tuning shaft 12 via the channel selector shaft 20 and the gears 16 and 18. This causes a pair of rotor plates 34 and 36 of a variable capacitor 38 to be rotated with respect to a stationary stator plate 40, thereby adjusting the operating frequency of the local oscillator of the tuner 10. In addition, second and third variable capacitors (not shown), each similar to the capacitor 38, are also adjusted by the main tuning shaft 12 for tuning the antenna and mixing circuits of the tuner 10 in a conventional manner.

The local oscillator circuit (shown best physically in FIG. 4 and schematically in FIG. 11) utilizes an oscillator transistor 42 having an emitter resistor 44, a collector resistor 46 and a pair of base biasing resistors 48 and 50. A base bypass capacitor 52 serves to bypass the base of the transistor 42 to ground at radio frequencies, and a pair of capacitors 54 and 56 serve as feedback capacitors. In the present embodiment, the collector-to-emitter capacitance of the transistor 42 serves as the feedback capacitor 54, however, an external capacitor may be used to increase the value of the feedback capacitance. Similarly, the capacitance between the emitter lead of the transistor 42 and the case of the tuner 10 serves as the capacitor 56, but a separate capacitor may be used. A variable inductor 58 having a self-supporting coil 59 is connected to the variable capacitor 38 and to a fixed capacitor 60. The capacitors 38 and 60 and the variable inductor 58 form a tuned circuit for determining the operating frequency of the oscillator.

The ouput of the oscillator is coupled to a mixer diode 62 which also receives the television signal applied to a pair of antenna terminals 64 and 66 of the tuner 10. The signals from the antenna terminals 64 and 66 and from the oscillator are combined in the mixer diode 62 and generate an intermediate frequency signal at an output 68 of the tuner 10 for application to the intermediate frequency circuits of the television receiver (not shown). In the present embodiment, the signal from the oscillator is coupled to the mixer diode 62 by means of radiation between the oscillator and the mixer diode 62, but a direct or other electrical connection may also be used.

In operation, the rotation of the main tuning shaft 12 effected by the channel selector shaft 20 and the channel selector knob 28 adjusts the variable capacitor 38 a sufficient amount to tune the oscillator over the entire range of frequencies necessary to cover the UHF television band, thus providing coarse tuning for each channel in the UHF television band. Fine tuning is effected by the variable inductor 58 which tunes the oscillator over a more limited range of frequencies, generally less than the frequency separation between adjacent channels in the UHF band, and typically approximately ±3mHz. Since the antenna and mixer circuits (not shown) are generally broader than ±3mHz, and since the tuner is aligned well enough that the antenna and mixer circuits accurately track the oscillator circuit, only the oscillator circuit need be adjusted to provide fine tuning. The adjustment of the oscillator within the limited tuning range provided by the variable inductor 58 will not bring the received signal out of the pass band of the antenna and mixer circuits.

In accordance with an important aspect of the present invention, the variable inductor 58 is controlled by a fine tuning mechanism, generally designated by the reference numeral 70 (FIG. 4) located within a fine tuning shaft 72. The fine tuning mechanism 70 includes an axially movable inductor tuning shaft 74. An inductor tuning sleeve 76 is affixed to the axially movable tuning shaft 74 and serves to tune the inductor 58 when axially moved within the coil 59 by the fine tuning mechanism 70. In the present embodiment, the tuning sleeve 76 is fabricated from brass and serves to decrease the inductance of the inductor 58 when it is inserted into the coil 59; however, it may be fabricated from other materials, such as, for example, a ferromagnetic material such as iron that serves to increase the inductance of the inductor 58 as the sleeve 76 is inserted into the coil 59.

A biasing spring 78 serves to bias the inductor tuning shaft 74 in a rearward direction, and maintains a conically shaped portion 80 of the inductor tuning shaft 74 in contact with a ball 82. The inductor tuning shaft 74 and the biasing spring 80 are retained within the channel selector shaft 20 which, in the present embodiment, is formed in two shaft sections 20a and 20b to permit the inductor tuning shaft 74 and the biasing spring 78 to be inserted into the hollow shaft section 20a.

The fine tuning shaft 72 is rotatably supported by the shaft section 20b of the channel selector shaft 20, and retained in place by a C-ring 83. The fine tuning shaft 72 includes an enlarged section 84 having a counter bore 86 formed therein. The counter bore 86 has a central axis that is radially displaced from the axis of the fine tuning shaft 72, and causes the ball 82 to be radially displaced with respect to the inductor tuning shaft 74 as the fine tuning shaft 72 is rotated by a fine tuning knob 88. An aperture 90 formed in the section 20a of the channel selector shaft 20 permits the ball 82 to move axially with respect to the channel selector shaft 20, but inhibits circumferential movement.

As previously mentioned, rotation of the fine tuning shaft 72 imparted to the shaft 72 by the fine tuning knob 88 causes the ball 82 to be displaced radially from the axis of the channel selector shaft 20 and the inductor tuning shaft 74. This radial displacement causes an axial displacement of the inductor tuning shaft 74 as a result of the contact between the ball 82 and the conical surface 80, and changes in degree of insertion of the sleeve 76 into the coil 59. For example, when the ball 82 is displaced the maximum distance from the axis of the inductor tuning shaft 74 (FIGS. 4 and 6), the ball 82 contacts the conical surface 80 at a point near the largest diameter of the conically shaped surface 80 and permits the inductor tuning shaft 74 to be biased by the spring 78 the maximum amount in the rearward direction. This causes the maximum degree of insertion of the sleeve 76 into the coil 59. When the fine tuning shaft 72 is rotated 180° so as to cause the ball 82 to be displaced to a position nearest the axis of the inductor tuning shaft 74 (FIGS. 9 and 10), the point of contact between the ball 82 and the conical surface 80 is moved to a point nearer the axis of the shaft 74 and results in a forward displacement of the shaft 74 against the force of the biasing spring 78. This forward motion of the shaft 74 results in a partial withdrawal of the sleeve 76 from the coil 59, and changes the inductance value of the variable inductor 58.

As can be seen from the drawings, the total displacement of the inductor tuning shaft 74 and the sleeve 76 is very small as the fine tuning shaft 72 is rotated between its 180° extremes, and the fine tuning system according to the present invention provides an efficient way to achieve rotary to axial motion translation while retaining a high positioning accuracy of the sleeve 76. Furthermore, the amount of axial movement of the sleeve 76 relative to the amount of rotation of the fine tuning shaft 72 may readily be altered by altering the amount of offset between the axes of the fine tuning shaft 72 and the counter bore 86. In addition, the amount of displacement of the sleeve 76 may be altered by changing the slope of the conically shaped surface 80. The amount and rate of displacement may also be altered by changing the shape of the surface 80 so that it has other than a linearly increasing diameter to achieve an axial motion of the sleeve 76 that is nonlinearly related to the position of the fine tuning shaft 72. For example, the surface 80 could be formed with an arcuately, parbolically, or otherwise nonlinearly increasing diameter. Also, the counter bore 86 could be made noncircular to achieve other linear or nonlinear effects. The position of the sleeve 76 may be altered with respect to the inductor tuning shaft 74 in the factory, or by a service man to adjust the nominal value of the inductor 58 so that the frequency of the tuner may be adjusted above and below the frequency of each UHF television channel by substantially equal amounts, thus centering the tuning range of the fine tuning system about each television channel.

An alternative embodiment of the invention wherein the coil 59 is not positioned coaxially with the inductor tuning shaft 74 is illustrated in FIG. 12. The embodiment illustrated in FIG. 12 utilizes a variable inductor 58' having a coil 59' connected to the capacitor 60' and the stator plate 40' of a variable capacitor 38'. A sleeve 76' is axially moved within the coil 59' by an inductor tuning shaft 74'. The components designated by primed numbers in FIG. 12 are analogous to components designated by similar unprimed numbers in FIGS. 1–11.

As in the previously described embodiment, the variable inductor 58' and the capacitors 38' and 60' form a tuned circuit for determining the frequency of oscillation of the local oscillator of the tuner 10 in response to the position of the inductor tuning shaft 74'. The tuning shaft 74' is controlled by a fine tuning mechanism (not shown) similar to the mechanism 70. The sleeve 76' is supported by a shaft 174 which is, in turn, supported by a flexible bracket 100 affixed to the case of the tuner 10 by a rivet 102 or otherwise. The bracket 100 is fabricated from a resilient material and is deflected by the axial movement of the inductor tuning shaft 74'. Such deflection causes an axial displacement of the shaft 174, and varies the position of the sleeve 76' within the coil 59'.

The above-described structure permits the coil 59' to be axially offset from the inductor tuning shaft 74', and increases tuner design flexibility. In addition, the degree of axial movement of the shaft 174 relative to the movement of the shaft 74' may be altered by altering the relative positions of the shaft 174, the shaft 74' and the rivel 102 to vary the mechanical advantage between the shaft 74' and the shaft 174. This permits the shaft 174 to be moved more than or less than the shaft 74' in response to a given movement of the shaft 74' as required by the design of any particular tuner, and further increases design flexibility.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A UHF television tuning system comprising:
   a UHF tuner having a housing, a continuously variable main tuning shaft rotation of which is effective to cause said tuner selectively to select signals on all channels in the UHF television band, a channel selector shaft, means interconnecting said channel selector shaft and said main tuning shaft, a fine tuning shaft associated with said channel selector shaft, detent means for said selector shaft for establishing a stop position of said main tuning shaft for each of the television channels in the UHF band, a mechanically variable capacitor mechanically coupled to said main tuning shaft, a variable frequency oscillator electrically coupled to said mechanically variable capacitor and having a frequency of oscillation that is adjustable upon rotation of said main tuning shaft over a range of frequencies predeterminedly related to the range of frequencies of the entire UHF television band for determining the frequency of the signal received by said UHF tuner, said variable frequency oscillator having a mechanically variable inductor electrically connected thereto; and
   means mechanically coupling said variable inductor to said fine tuning shaft for controlling the frequency of said oscillator to tune said tuner independently of the operation of said main tuning shaft over a range of frequencies corresponding to substantially less than the frequency range provided by said mechanically variable capacitor for fine tuning said UHF tuner.

2. A UHF television tuning system as recited in claim 1 wherein said coupling means includes motion translation means located within said fine tuning shaft for translating rotational motion of said fine tuning shaft to linear motion.

3. A UHF television tuning system as recited in claim 2 wherein said variable inductor includes a coil and a tuning member disposed in proximity to said coil, and wherein said system further includes means coupling said tuning member to said motion translating means for linearly moving said tuning member with respect to said coil in response to a rotational motion of said fine tuning shaft.

4. A UHF television tuning system as recited in claim 3 wherein said tuning member is fabricated from brass.

5. A UHF television tuning system as recited in claim 3 further including an axially movable inductor tuning shaft having an end mechanically coupled to said tuning member and an enlarged end disposed within said motion translating means, wherein said motion translating means includes a ball disposed adjacent said enlarged end and in contact therewith, said motion translating means further including means coupled to said fine tuning shaft for urging said ball into contact with said enlarged end and for moving said ball radially with respect to said inductor tuning shaft thereby to cause said ball to move said inductor tuning shaft axially in response to a rotation of said fine tuning shaft.

6. A UHF television tuning system as recited in claim 5 wherein said urging and moving means includes an enlarged section of said fine tuning shaft having a counter bore formed therein, said counter bore having a longitudinal axis that is displaced from the axis of rotation of said fine tuning shaft, and wherein said ball is received within said counter bore and retained within said counter bore in contact with said enlarged end of said inductor tuning shaft.

7. A UHF television tuning system as recited in claim 6 wherein said enlarged end of said inductor tuning shaft is substantially conically shaped.

8. A UHF television tuning system as recited in claim 6 wherein said counter bore is substantially cylindrically shaped.

9. A UHF television tuning system as recited in claim 5 further including deflectable means interposed between said tuning member and said end of said inductor tuning shaft for supporting said tuning member within said coil, said deflectable means being engageable by said end of said inductor tuning shaft and deflectable thereby for altering the position of said tuning member with respect to said coil.

10. In a UHF television tuner having a continuously variable main tuning shaft, a channel selector shaft mechanically coupled to said main tuning shaft, a fine tuning shaft coaxially disposed with said channel selector shaft, means for providing a plurality of detent positions for said channel selector shaft and means electrically coupled to said UHF television tuner for adjusting the tuning thereof independently of said main tuning shaft, the improvement comprising:
an axially movable shaft disposed within said channel selector shaft, said axially movable shaft having an end mechanically coupled to said tuning adjusting means and an enlarged end having an axially varying diameter;
a ball member disposed adjacent said axially movable shaft in contact with said enlarged end;
resilient biasing means disposed within said channel selector shaft for urging said axially movable shaft toward said tuning adjusting means;
means for retaining said ball member and limiting the circumferential travel of said ball member about said axially movable shaft; and
means coupled to said fine tuning shaft for radially displacing said ball member with respect to said axially movable shaft to thereby alter the point of contact between said enlarged end and said ball member, thereby axially moving said axially movable shaft away from said tuning adjusting means.

11. The improvement recited in claim 10 wherein said radially displacing means includes an enlarged diameter member rotatable by said fine tuning shaft having a curved wall axially displaced from said axially movable shaft and retaining said ball member between said enlarged end and said wall, the distance between said axially movable shaft and different portions of said wall being nonuniform for causing said ball member to be radially displaced with respect to said axially movable shaft upon a rotation of said enlarged diameter member by said fine tuning shaft.

12. The improvement recited in claim 11 wherein the wall of said enlarged diameter member defines a substantially cylindrically shaped chamber having a longitudinal axis radially displaced from the axis of said axially movable shaft.

13. The improvement recited in claim 12 wherein said enlarged end is substantially conically shaped.

14. The improvement recited in claim 11 wherein said tuning adjusting means includes a coil and a tuning member, said coil being electrically coupled to said UHF tuner and said tuning member being mechanically coupled to said axially movable shaft.

15. The improvement recited in claim 14 further including deflectable means interposed between said tuning member and said axially movable shaft for supporting said tuning member within said coil, said deflectable means being deflectable by said axially movable shaft for altering the relative position of said tuning member and said coil.

16. A television tuning system as recited in claim 1 wherein mechanically variable inductor includes a coil and a tuning member disposed in proximity to said coil, and wherein said mechanical coupling means includes motion translating means mechanically coupled to said fine tuning shaft and means mechanically coupling said tuning member to said motion translating means for effecting relative movement between said tuning member and said coil in response to a rotational motion of said fine tuning shaft.

17. A television tuning system as recited in claim 16 wherein said means for effecting relative movement between said tuning member and said coil includes means for moving said tuning member with respect to said coil.

18. A UHF tuning system as recited in claim 17 wherein said tuning member is fabricated from a material that alters the inductance of said coil.

19. A UHF tuning system as recited in claim 18 wherein said tuning member is fabricated from a material that reduces the inductance of said coil when brought into proximity therewith.

20. A UHF tuning system as recited in claim 19 wherein said material is brass.

21. A UHF tuning system as recited in claim 18 wherein said tuning member is fabricated from a material that increases the inductance of said coil when brought into proximity therewith.

22. A UHF tuning system as recited in claim 21 wherein said material is a ferromagnetic material.

* * * * *